United States Patent [19]

Jones

[11] 4,400,407
[45] Aug. 23, 1983

[54] METHOD FOR DEPOSITION OF THIN FILM ALLOYS UTILIZING ELECTRON BEAM VAPORIZATION

[75] Inventor: Addison B. Jones, Yorba Linda, Calif.

[73] Assignee: Rockwell International Corporation, El Segundo, Calif.

[21] Appl. No.: 283,580

[22] Filed: Jul. 15, 1981

Related U.S. Application Data

[62] Division of Ser. No. 220,397, Dec. 29, 1980, Pat. No. 4,368,689.

[51] Int. Cl.³ .............................................. C23C 13/02
[52] U.S. Cl. .......................................... 427/8; 427/9; 427/10; 427/42
[58] Field of Search ............................ 427/8, 9, 10, 42

[56] References Cited

U.S. PATENT DOCUMENTS 2,584,660  2/1952  Bancroft ............................. 427/45.1
4,237,148  12/1980  Aichert et al. ........................ 427/42

Primary Examiner—James R. Hoffman
Attorney, Agent, or Firm—H. Fredrick Hamann; Wilfred G. Caldwell

[57] ABSTRACT

The invention is an apparatus and method for achieving thin film deposition, of uniform composition, from evaporated alloys. A source of wire alloy, selected for the particular thin film deposition on a substrate, is continuously fed through a region of high speed electron bombardment confined to an end of the wire, for evaporation of the wire in the vicinity of the substrate. An ion flux detector controls the rate of feeding of the wire source in accordance with the detected flux to lay down a uniform thin film of predetermined thickness. A high potential is established between the wire and the source of the electrons and the liberated electrons are guided by the electric field toward the end of the wire being evaporated, which serves as an anode.

5 Claims, 1 Drawing Figure

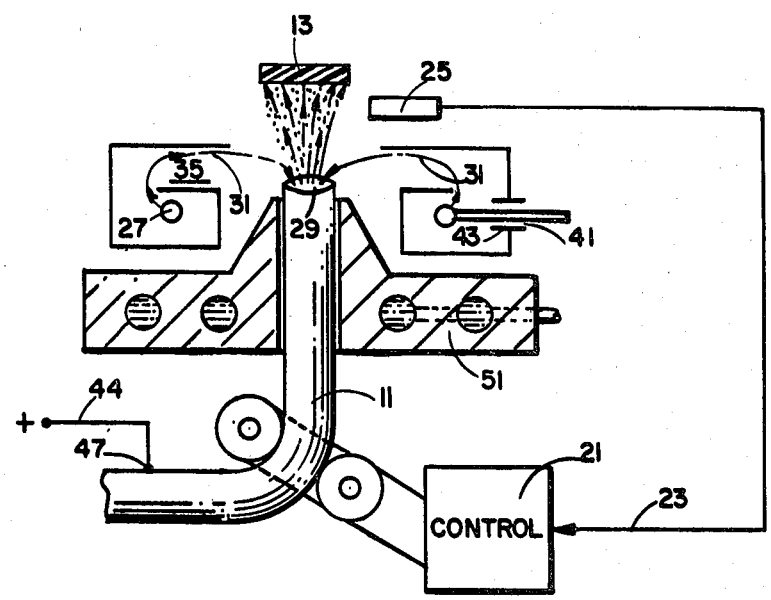

METHOD FOR DEPOSITION OF THIN FILM ALLOYS UTILIZING ELECTRON BEAM VAPORIZATION

This application is a division, of application Ser. No. 220,397, filed Dec. 29, 1980, now U.S Pat. No. 4,368,689.

FIELD OF THE INVENTION

The present invention relates to the deposition of thin films of an alloy of given composition by bombarding a wire source of such alloy adjacent an end thereof by high speed electrons and detecting the ion flux generated in the vicinity of a substrate being coated to provide a speed control for advancement of the wire.

PRIOR ART

It is conventional to evaporate alloys for thin film deposition but constituents of the alloy frequently have different vapor pressures at the evaporation temperatures, and the deposited film will have different composition than the source. Also, the deposited film composition will change as the deposition proceeds. Another means for achieving evaporation has been utilized to employ a source of wire fed into a hot plate. However, limitations to this process involve the necessary selection of but a few types of material which may be evaporated by considering the melting point of the alloy and chemical reactivity of the plate. Also, thermal radiation from the plate is another limiting factor.

SUMMARY OF THE INVENTION

The invention comprises a method and apparatus for thin film deposition wherein a source of alloy wire of the composition of the thin film to be deposited is provided for moving an end thereof through a high potential region wherein high speed electrons are caused to bombard or impact the end of the wire to vaporize it onto a substrate, and means are provided for controlled advancing of the wire, as it is utilized.

BRIEF DESCRIPTION OF THE DRAWING

The single FIGURE shows an arrangement for illustrating the apparatus utilized and the method of achieving the thin film deposition from a wire comprised of the alloy intended to be deposited.

DESCRIPTION OF THE PREFERRED EMBODIMENT

In the FIGURE, there is shown a wire 11 selected from alloys for the particular thin film deposition required to coat substrate 13. The wire 11 is driven by rollers 15 and 17 connected by driving belt 19 to control 21 which may simply comprise a conventional speed control. The speed control 21 is actuated via lead 23 which extends to ion flux detector 25. Other types of deposition rate monitor, such as a micro balance or quarte crystal oscillator, may be used in lieu of the ion flux detector. A threshold or minimum may be set at flux detector 25 below which the source wire 11 is not moved, but above which it is moved to furnish fresh wire to the evaporating region. Of course, the system may use continuous detection and continuous advancing through variable speed control. The deposition rate signal may also be used to control power to the filament. But in any event only commercially available devices are employed for the detector and control and thus do not form any unique elements in the proposed method and combination subject matter.

Control 21 may also comprise the power control source for the electron source via lead 41 and the detection signal may be used to control electron bombardment.

The electron source comprises the filament 27 which is preferrably concentrically disposed with respect to the source wire 11, but may comprise shorter lengths of filament wire deployed in a suitable manner to bombard the end 29 of the wire 11 being fed forwardly into the field of electrons, shown by the traces 31, as leaving the filament 27 and bombarding the end 29 of wire 11.

A shield 33 is included around the filament 27 with an opening 35 provided to guide the electrons in the direction of the wire end 29. An electrical lead 41 extends to filament 27 and penetrates shield 33 at opening 43. However, it is usually desirable to have the shield 33 at the same potential as the filament 27. This potential may be ground or may be several thousand electron volts below ground. The other lead 44 is shown extending from a positive or zero source to a tiny roller or slider 47 in contact with source wire 11. In any event, it is only n necessary that the source of electrons 27 be several thousand electron volts negative relative to the potential of the source wire 11 for the electrons to be attracted to the latter as the anode for high speed impact therewith.

Optionally, a water cooled sleeve 51 is provided about the wire 11 and extends toward end 29. This prevents the wire 11 from melting except where intended at the point of impact.

Thus, the concept of continuous feed of the wire source of the same composition as the desired thin film has been described. The evaporation is accomplished by direct bombardment and heating of the wire source of electrons. Particularly important applications for this approach involve the use of silicon and copper doped aluminum and permalloy.

Other innovations of control are readily available (e.g.) detector 25 may be a menisus detector or a pyrometer and either signal therefrom may be used to control speed advance for wire 11 or power to filament 11 or source power between leads 41 and 44.

While modifications of this preferred embodiment will occur to those skilled in the art, nevertheless the principles of the invention are incorporated in the appended claims which are intended to define the scope of this invention.

What is claimed is:

1. The method of evaporation of alloys for thin film deposition on substrates comprising the steps of:
   bombarding an end of a wire of alloy, selected for deposition in the vicinity of the substrate by high speed voltage attracted electrons; and,
   feeding the wire to replace the end being vaporized.

2. The method of evaporation of alloys for thin film deposition on substrates comprising the steps of:
   bombarding an end of a wire of alloy, selected for deposition, in the vicinity of the substrate by high speed voltage attracted electrons;
   feeding the wire to replace the end being vaporized; and controlling the feeding of the wire in accordance with deposition rate detected in said vicinity.

3. The method of claim 2, wherein:
   said deposition rate is detected by means of ion flux measurement.

4. The method of evaporation of alloys for thin film deposition on substrates comprising the steps of:
bombarding an end of a wire of alloy, selected for deposition, in the vicinity of the substrate by high speed voltage attracted electrons;
feeding the wire to replace the end being vaporized; and controlling the energy of the high speed electrons in accordance with deposition rate desired.

5. The method of evaporation of alloys for thin film deposition on substrates comprising the steps of:
bombarding an end of a wire of alloy, selecting for deposition, in the vicinity of the substrate by high speed voltage attracted electrons;
feeding the wire to replace the end being vaporized; and controlling the bombarding energy of the high speed electrons being in accordance with a characteristic of said end to determine the rate of deposition.

* * * * *